United States Patent
Zhang

(10) Patent No.: US 8,758,964 B2
(45) Date of Patent: Jun. 24, 2014

(54) LCD PANEL PHOTOLITHOGRAPHY PROCESS AND MASK

(71) Applicant: Shenzhen China Star Optoelectronics Technology Co., Ltd., Shenzhen (CN)

(72) Inventor: Cai-li Zhang, Shenzhen (CN)

(73) Assignee: Shenzhen China Star Optoelectronics Technology Co. Ltd., Shenzhen (CN)

( * ) Notice: Subject to any disclaimer, the term of this patent is extended or adjusted under 35 U.S.C. 154(b) by 0 days.

(21) Appl. No.: 14/056,492

(22) Filed: Oct. 17, 2013

(65) Prior Publication Data

US 2014/0045104 A1 Feb. 13, 2014

Related U.S. Application Data

(62) Division of application No. 13/216,729, filed on Aug. 24, 2011, now Pat. No. 8,592,111.

(51) Int. Cl.
*G03F 1/42* (2012.01)

(52) U.S. Cl.
CPC .................................... *G03F 1/42* (2013.01)
USPC ................................................ 430/5; 430/22

(58) Field of Classification Search
CPC ........................................................ G03F 1/42
USPC ...................................................... 430/5, 22
See application file for complete search history.

(56) References Cited

U.S. PATENT DOCUMENTS 7,279,257 B2  10/2007  Takizawa
7,855,035 B2  12/2010  Naoe

FOREIGN PATENT DOCUMENTS

| CN | 1551310 | 12/2004 |
| CN | 1677616 | 10/2005 |
| JP | 2004272167 | 9/2004 |
| JP | 2007256581 | 10/2007 |

*Primary Examiner* — Christopher Young
(74) *Attorney, Agent, or Firm* — Diederiks & Whitelaw, PLC

(57) ABSTRACT

Disclosed is an LCD panel photolithography process, employed in a lithography system for manufacturing a plurality of LCD panel, comprising steps of: performing photolithography to a glass substrate with a first mask, and the first mask comprises a plurality of sets of alignment marks corresponding to a plurality of following masks thereafter, and a plurality of sets of alignment marks corresponding to the plurality of following masks thereafter are formed on the glass substrate; and employing the plurality of sets of alignment marks on the glass substrate respectively, to perform alignment procedure and photolithography for the plurality of following masks with the plurality of sets of alignment marks on the glass substrate to form patterns; wherein corresponding to the same LCD panel area, the plurality of sets of alignment marks on the glass substrate have different position coordinates respectively.

5 Claims, 7 Drawing Sheets

LCD PANEL PHOTOLITHOGRAPHY PROCESS AND MASK

CROSS REFERENCE TO RELATED APPLICATION

This is a division of a U.S. patent application Ser. No. 13/216,729, filed on Aug. 24, 2011.

BACKGROUND OF THE INVENTION

1. Field of the Invention

The present invention generally relates to a photolithography process to a glass substrate and a mask thereof, and more particularly to an LCD panel photolithography process and a mask thereof, to prevent the rework and abandonment circumstances of the glass substrate cause of aligning the alignment mark of the wrong mask in the alignment procedure of the lithography system. Accordingly, the manufacture yield rate of LCD panel can be improved.

2. Description of Prior Art

Please refer to FIG. 1. When the LCD panel is manufactured, a lithography system (such as the lithography system of Canon) is used. An issue of a certain shift of the entire patterns occurs in some real manufactures. After the investigation, the reason is that the alignment mark of the wrong mask is aligned in the alignment procedure to result in the abnormal pattern appears. With depth analysis and then the root cause is found, the structure design of the alignment marks inevitably results in such exception. Hereafter, the basic principle of an alignment system of Canon lithography system is introduced below:

Please refer to FIG. 2, which shows a structure diagram of an alignment system. The light generated by the light source passes through the main optical system and reaches the mask and the glass substrate respectively. After reflection, the image of the alignment marks A, C on the mask and the image of the alignment mark B on the glass substrate passes through the objective lens and the alignment scope. Then, these images are fetched by the CCD. Thereafter, the images of the alignment marks A, B, C are transmitted to the image processor and then shown on the monitor. When the center of the alignment mark B coincides with the center of the alignment marks A, C, it means that the alignment procedure succeeds. If the center of the alignment mark B does not coincide with the center of the alignment marks A, C, the load system of the glass substrate is actuated to move the glass substrate till the center of the alignment mark B coincides with the center of the alignment marks A, C. Then the alignment procedure before the photolithography process is completed.

Please refer to FIG. 3 shows a diagram of an arrangement for the alignment marks of different masks according to prior art. In previous masks, the arrangement of alignment marks is linear symmetric designed, even for the arrangement of alignment marks of different masks. Besides, the distances between the alignment marks of different masks are all the same. As shown in the figure, there are alignment marks both at top and bottom of the LCD panels and $D_2=D_3=\ldots=D_n$ (The alphabet n represents the layer of mask). In figure, five masks are illustrated with $D_2=D_3=D_4=D_5$, the design defect in previous masks is when one mask is employed for performing the alignment procedure, but the shapes of the alignment marks of different masks are all the same and the positions are linear symmetric designed. Thereof, the lithography system cannot judge which mask the alignment mark employed in the alignment procedure belongs to. Even the alignment mark of the wrong mask is employed for alignment, the alignment procedure still can succeed and complete. Consequently, the circumstance that the wrong mask is aligned occurs and results in the issue of the certain shift of the entire patterns shown in FIG. 1. In the illustration of five masks with $D_2=D_3=D_4=D_5$, when the second mask is aligned, and the third mask, fourth mask and the fifth mask exist. When the second mask is being aligned, the lithography system misses the alignment mark of the second mask and aligns with the alignment mark of the third mask because the position of the glass substrate is shifted. Because no differences exist between the alignment mark of the second mask and the alignment mark of third mask, the lithography system of the user considers the alignment procedure is completed. Then, the photolithography process is performed and completed. The issue of the certain shift of the entire patterns shown in FIG. 1 occurs due to aligning with the wrong mask. Accordingly, a huge number of the glass substrates have to rework or abandoned and leads to an enormous lost.

Consequently, there is a need to provide an LCD panel photolithography process and a mask thereof.

SUMMARY OF THE INVENTION

An objective of the present invention is to provide an LCD panel photolithography process and a mask thereof to prevent the rework and abandonment circumstances of the glass substrate happened cause of employing the alignment mark of the wrong mask in the alignment procedure of the lithography system. Accordingly, the manufacture yield rate of LCD panel can be improved.

For realizing the aforesaid objective, the present invention provides an LCD panel photolithography process and a mask thereof, employed in a lithography system for manufacturing a plurality of LCD panel. The LCD panel photolithography process of the present invention comprises steps below: performing photolithography to a glass substrate for manufacturing the plurality of LCD panels with a first mask, and the first mask comprises a plurality of sets of alignment marks corresponding to a plurality of following masks thereafter, and a plurality of sets of alignment marks corresponding to the plurality of following masks thereafter are formed on the glass substrate; and employing the plurality of sets of alignment marks on the glass substrate corresponding to the plurality of following masks thereafter respectively, to perform alignment procedure and photolithography for the plurality of following masks with the plurality of sets of alignment marks on the glass substrate according to a sequence of the plurality of following masks to form patterns; wherein corresponding to the same LCD panel area, the plurality of sets of alignment marks on the glass substrate needed for the plurality of following masks have different position coordinates respectively.

In one embodiment of the LCD panel photolithography process according to the present invention, after the step of performing photolithography to the glass substrate with the first mask, the plurality of sets of alignment marks formed on the glass substrate are at two sides of the plurality of LCD panel areas, and corresponding to the same LCD panel area, each set of alignment marks comprises at least two alignment marks at the two sides, and the at least two alignment marks have different opposite distances.

In one embodiment of the LCD panel photolithography process according to the present invention, corresponding to the same LCD panel area, the opposite distances between the at least two alignment marks of the each set of alignment marks are gradually increased or decreased in sequence.

In one embodiment of the LCD panel photolithography process according to the present invention, corresponding to the same LCD panel area, the opposite distances between the at least two alignment marks of the each set of alignment marks are gradually increased and then decreased in sequence.

In one embodiment of the LCD panel photolithography process according to the present invention, the plurality of sets of alignment marks formed on the glass substrate have respective x-coordinates and y-coordinates relative to an arbitrary side of the same LCD panel area.

For realizing the aforesaid objective, the present invention provides another LCD panel photolithography process, employed in a lithography system for manufacturing a plurality of LCD panel to perform photolithography to a glass substrate for manufacturing the plurality of LCD panels, comprising: performing photolithography to a glass substrate with a first mask, and the first mask has a plurality of sets of alignment marks corresponding to a plurality of following masks thereafter, and a plurality of sets of alignment marks corresponding to the plurality of following masks thereafter are formed on the glass substrate; and performing photolithography to the glass substrate with a second mask, which is the last mask in the plurality of following masks thereafter, and the second mask comprises respective sets of alignment marks corresponding to respective following masks thereafter, and respective sets of alignment marks corresponding to the respective following masks thereafter are formed on the glass substrate; wherein after the photolithography of the first mask is performed, the plurality of sets of alignment marks on the glass substrate needed for the plurality of following masks have different position coordinates respectively corresponding to the same LCD panel area; and after the photolithography of the second mask is performed, the respective sets of alignment marks on the glass substrate needed for the respective following masks also have different position coordinates respectively corresponding to the same LCD panel area.

In one embodiment of the LCD panel photolithography process according to the present invention, after the step of performing photolithography to the glass substrate with the first mask, the plurality of sets of alignment marks formed on the glass substrate are at two sides of the plurality of LCD panel areas, and corresponding to the same LCD panel area, each set of alignment marks comprises at least two alignment marks at the two sides, and the at least two alignment marks have different opposite distances.

In one embodiment of the LCD panel photolithography process according to the present invention, after the step of performing photolithography to the glass substrate with the second mask, the respective sets of alignment marks formed on the glass substrate are at two sides of the plurality of LCD panel areas, and corresponding to the same LCD panel area, each set of alignment marks comprises at least two alignment marks at the two sides, and the two alignment marks have different opposite distances.

For realizing the aforesaid objective, the present invention provides a mask employed in an LCD panel photolithography process of a lithography system for manufacturing a plurality of LCD panel, for performing photolithography to a glass substrate for manufacturing the plurality of LCD panels. The mask of the present invention comprises: a plurality of LCD panel areas, employed for forming patterns on the glass substrate; and a plurality of sets of alignment marks, employed for forming a plurality of sets of alignment marks corresponding to the plurality of following masks thereafter, and the plurality of sets of alignment marks for the plurality of following masks have different position coordinates on the mask respectively.

In one embodiment of the mask according to the present invention, at two sides of the same LCD panel area, the respective sets of alignment marks corresponding to the respective masks comprises at least two alignment marks, and opposite distances between the at least two alignment marks of each set of alignment marks are gradually increased or decreased in sequence.

According to the LCD panel photolithography process and the mask thereof of the present invention, the rework and abandonment circumstances of the glass substrate happened cause of employing the alignment mark of the wrong mask in the alignment procedure of the lithography system can be prevented. Accordingly, the manufacture yield rate of LCD panel can be improved.

DETAILED DESCRIPTION OF THE INVENTION

Figure 4:
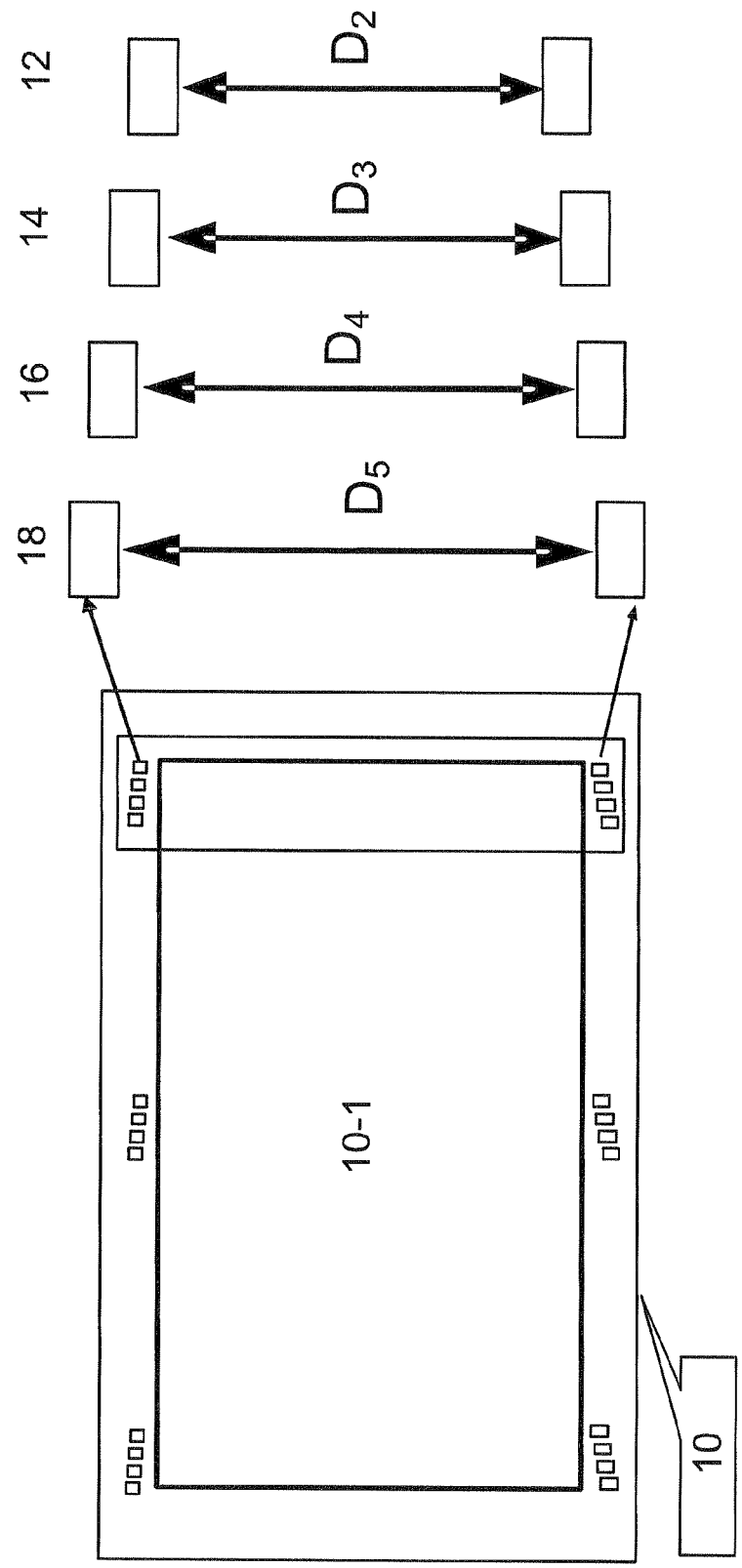
FIG. 4 shows a diagram of an arrangement for the alignment marks of different masks according to the present invention.
Figure 5:
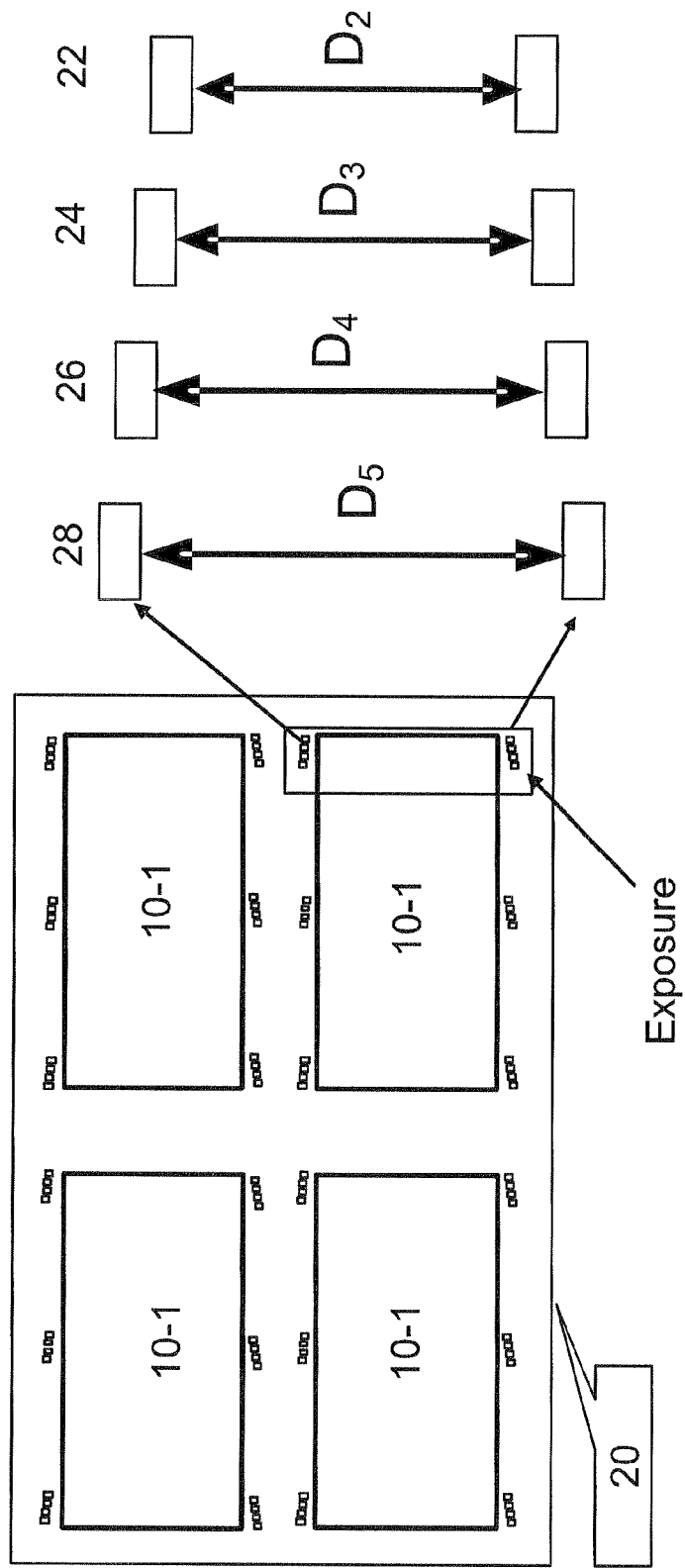
FIG. 5 shows a diagram of an arrangement of the alignment marks formed on a glass substrate with the alignment marks of different masks according to the present invention.
Figure 6:
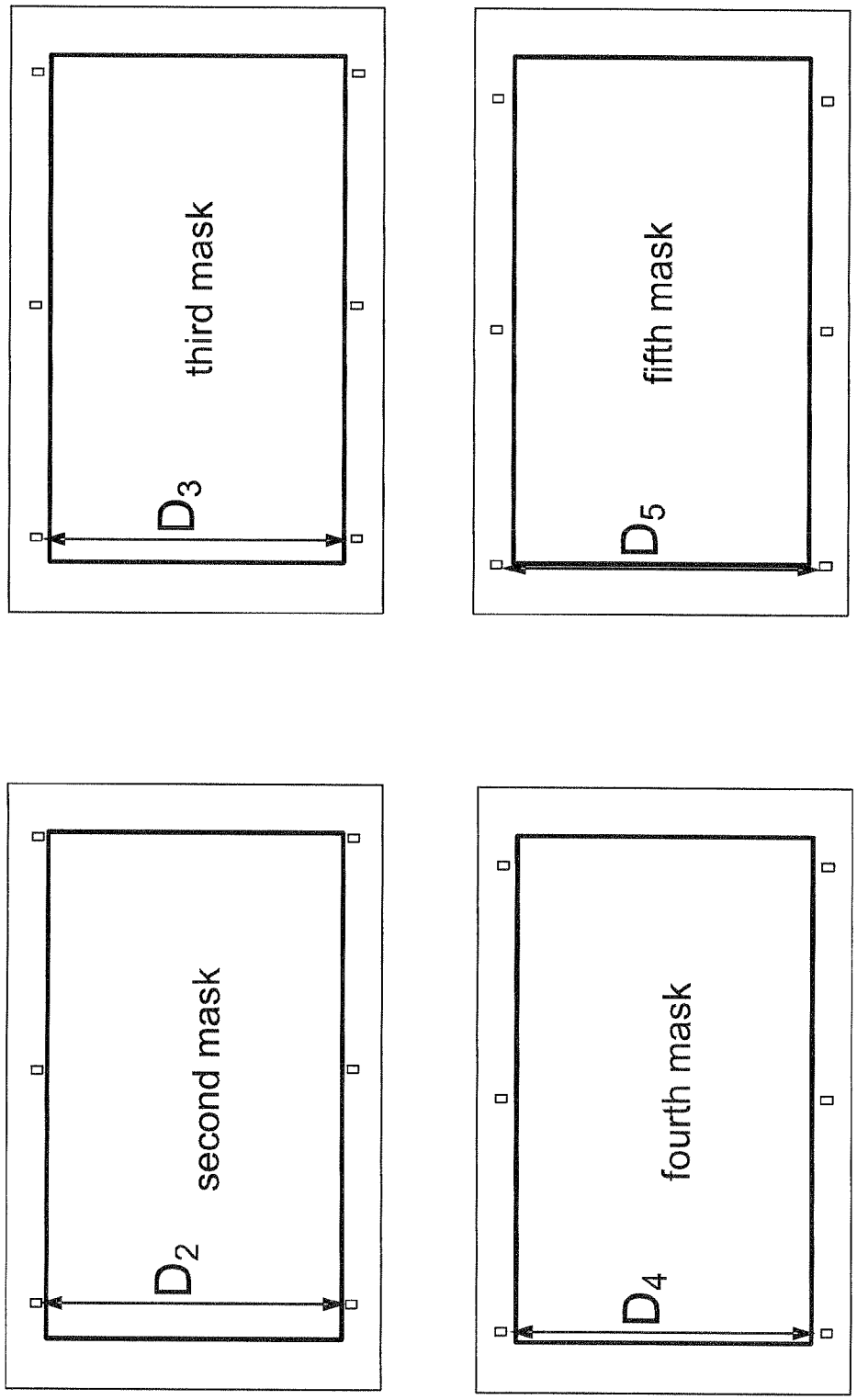
FIG. 6 shows a diagram of the alignment marks of different masks according to the present invention.

For a better understanding the aforementioned content of the present invention, preferable embodiments are illustrated in conjunction with the attached figures for further explanation:

Please refer to FIG. 4, FIG. 5 and FIG. 6. FIG. 4 shows a diagram of an arrangement for the alignment marks of different masks according to the present invention. FIG. 5 shows a diagram of an arrangement of the alignment marks formed on a glass substrate 20 with the alignment marks of different masks according to the present invention. FIG. 6 shows a diagram of the alignment marks of different masks according to the present invention.

Figure 1:
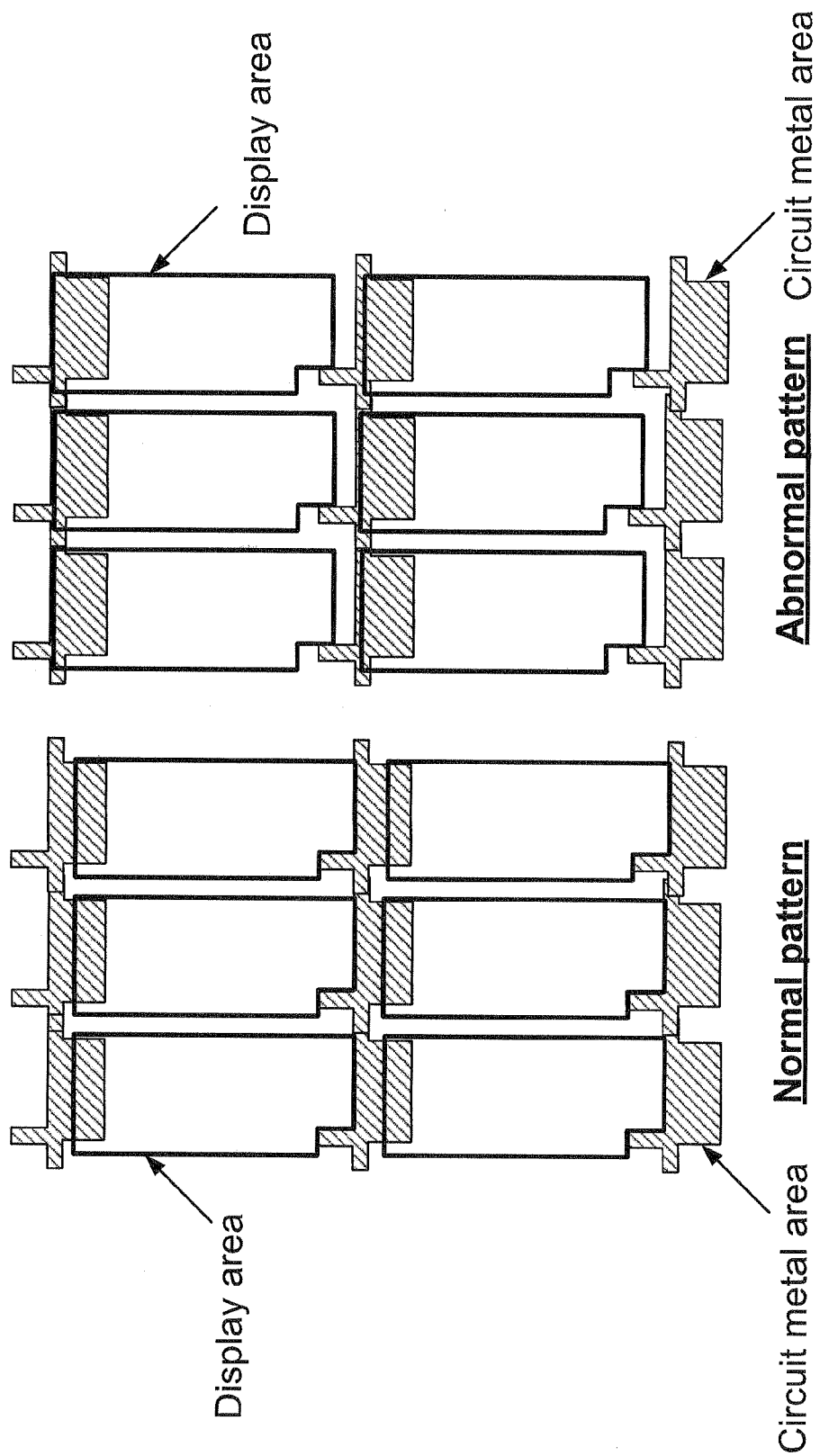
FIG. 1 shows a diagram of issue that a certain shift of the entire patterns occurred in prior art.
Figure 2:
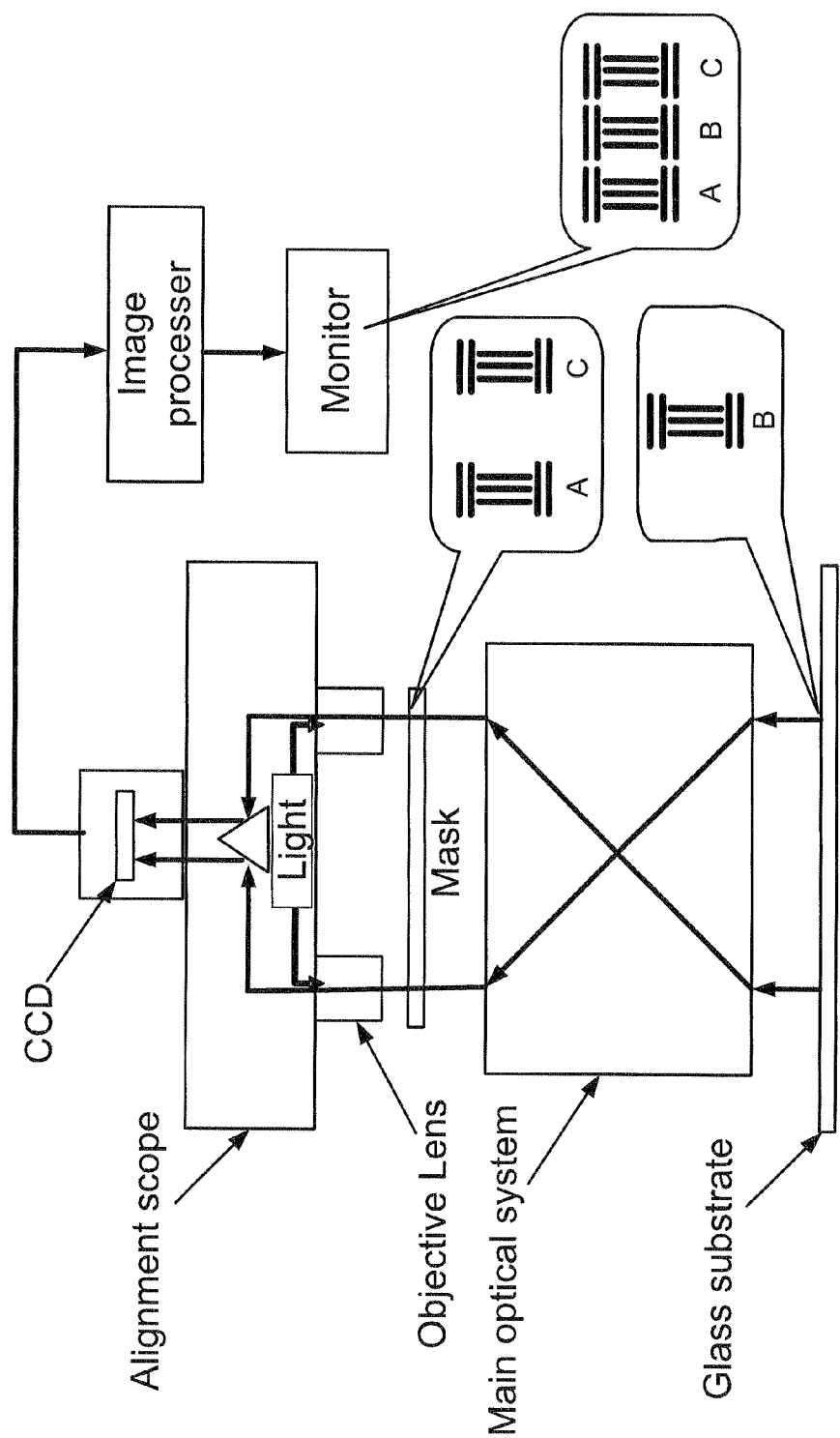
FIG. 2 shows a structure diagram of an alignment system of the lithography system according to prior art.
Figure 3:
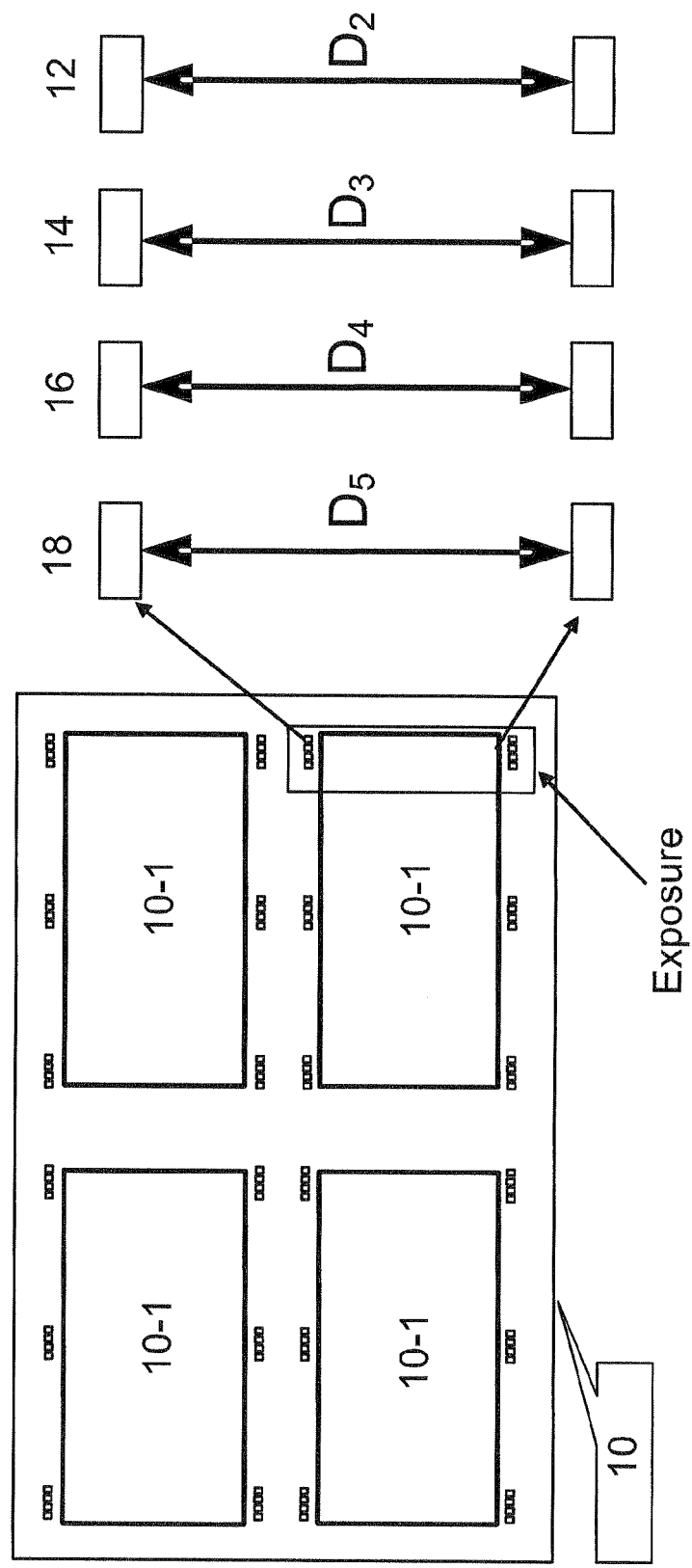
FIG. 3 shows a diagram of an arrangement for the alignment marks of different masks according to prior art.

One mask of the present invention shown in FIG. 4, FIG. 5 and FIG. 6 is employed in a photolithography process of a lithography system shown in FIG. 2 for manufacturing a LCD panel. The mask of the present invention comprises a plurality of LCD panel areas 10-1 and a plurality of sets of alignment marks. FIG. 4 shows merely one LCD panel area 10-1 for further explaining the present invention in detail but FIG. 5 and FIG. 6 shows four LCD panel areas 10-1 in practical. In this embodiment of the present invention, a manufacture process with five masks is illustrated but more masks can be here according to the demands of the LCD panel manufacture process. If processes with six masks or seven masks are needed for manufacturing the LCD panel, a sixth set of alignment marks or a seventh set of alignment marks can be added further in the present invention. Shown in FIG. 4 is a first mask 10 of the present invention. The first mask 10 comprises a plurality of LCD panel areas 10-1. The plurality of LCD panel areas 10-1 are employed for forming patterns on the glass substrate 20. The first mask 10 comprises a second set of alignment marks 12, a third set of alignment marks 14, a fourth set of alignment marks 16 and a fifth set of alignment marks 18 corresponding to a second mask, a third mask, a fourth mask and a fifth mask, respectively. The second set of alignment marks 12, the third set of alignment marks 14, the fourth set of alignment marks 16 and the fifth set of alignment marks 18 of the first mask 10 are arranged at top and bottom of the LCD panel area 10-1 oppositely and correspondingly. In another word, corresponding to the following masks, the first mask 10 totally comprises three pairs, six alignment marks at the top and bottom respectively but not limited thereto. Meanwhile, as aforementioned, the sixth set of alignment marks or the seventh set of alignment marks can be further added in the present invention, if processes with six masks or seven masks are needed for manufacturing the LCD panel. At the top and bottom of the LCD panel, the sixth set of alignment marks or the seventh set of alignment marks can be added respectively. Accordingly, at the top of the bottom of each LCD panel 10-1 of the glass substrate 20, five or six alignment marks can be formed. Each set of the alignment marks can be arranged at the top and bottom oppositely and correspondingly.

When the first mask 10 is employed in a photolithography process performed to the glass substrate 20 of LCD panel, as shown in FIG. 5, the plurality of sets of alignment marks are formed on the glass substrate 20. The plurality of sets of alignment marks correspond to the plurality of following masks, i.e. the second set of alignment marks 22, the third set of alignment marks 24, the fourth set of alignment marks 26 and the fifth set of alignment marks 28. Corresponding to the same LCD panel area 10-1, such as the second set of alignment marks 22, the third set of alignment marks 24, the fourth set of alignment marks 26 and the fifth set of alignment marks 28 at the top of the LCD panel area 10-1 on the first mask 10 have different position coordinates respectively, i.e. different x-coordinates and different y-coordinates. (Similarly, each set of the alignment marks at the bottom of the LCD panel area 10-1 also have different x-coordinates and different y-coordinates). In other words, relative to an arbitrary point on the first mask 10 or relative to an arbitrary side of the LCD panel area 10-1, the respective x-coordinates and y-coordinates of the centers of the second set of alignment marks 12, the third set of alignment marks 14, the fourth set of alignment marks 16 and the fifth set of alignment marks 18 are all different to one another. Namely, the second set of alignment marks 12, the third set of alignment marks 14, the fourth set of alignment marks 16 and the fifth set of alignment marks 18 on the first mask 10 are not arranged with linear symmetric design, but arranged with offset design. For example, the opposite distances between the second set of alignment marks 12, the third set of alignment marks 14, the fourth set of alignment marks 16 and the fifth set of alignment marks 18 are gradually increased or decreased in sequence. Alternatively, the opposite distances between the second set of alignment marks 12, the third set of alignment marks 14, the fourth set of alignment marks 16 and the fifth set of alignment marks 18 can be gradually increased and then decreased in sequence.

Furthermore, in the embodiment of the present invention, the plurality of sets of alignment marks is illustrated to be arranged at top and bottom of the LCD panel area 10-1 oppositely and correspondingly, but the plurality of sets of alignment marks also can be arranged at the left and right of the LCD panel area 10-1. Meanwhile, the arrangement with offset design illustrated shown in FIG. 4 is a cascade rise or drop arrangement but the present invention is not limited thereto. The arrangement for the plurality of sets of alignment marks also can be alternate high-low design or waveform design, as long as the arrangement for the plurality of sets of alignment marks is non-linear symmetric design and the serious problem of aligning the alignment mark of the wrong mask in prior art can be prevent.

Figure 7:
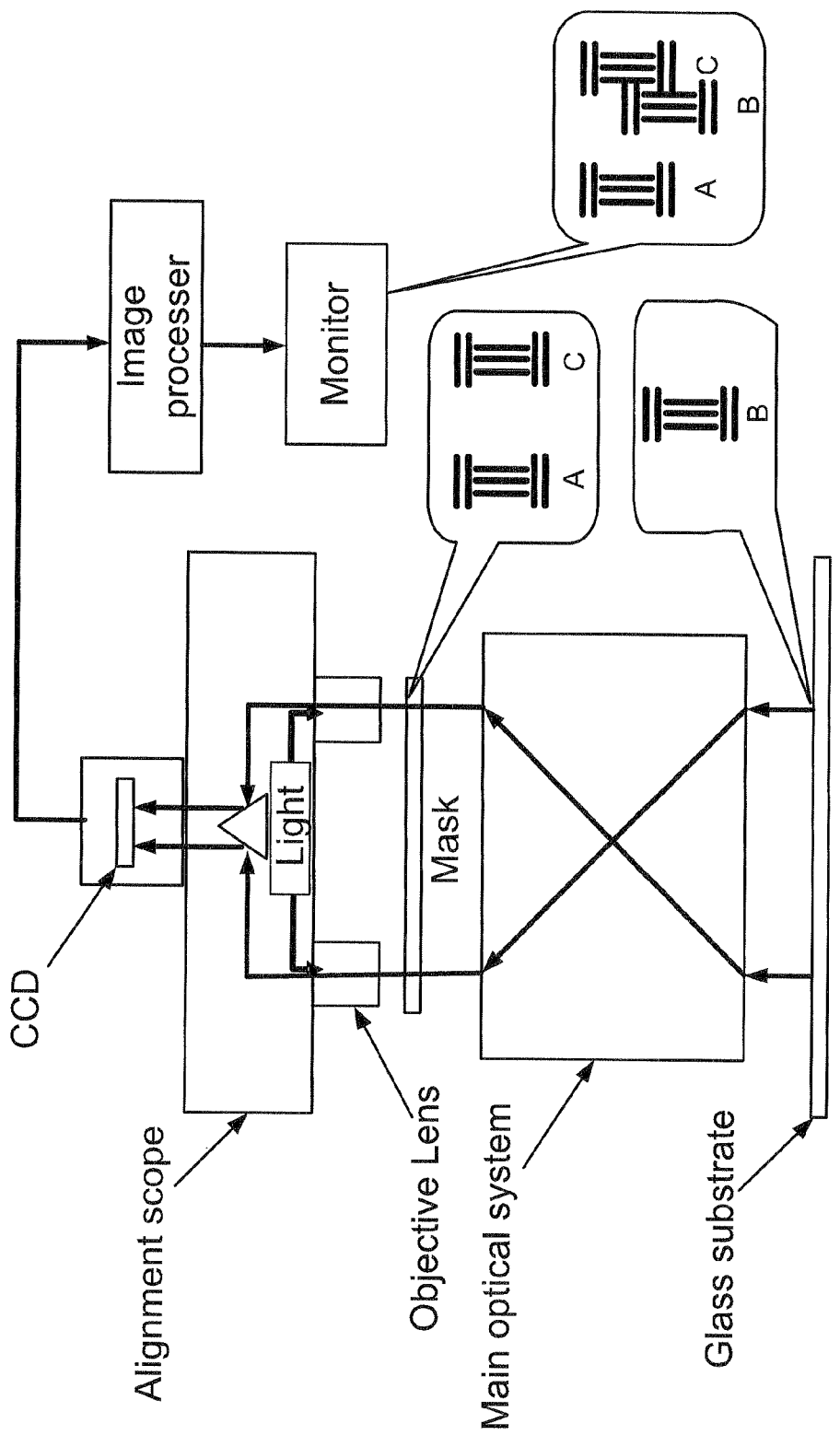
FIG. 7 shows a diagram of that the alignment procedure cannot complete if the alignment mark of the wrong mask is aligned in the alignment system of the lithography system according to the present invention.

Accordingly, as shown in FIG. 5, similarly, the second set of alignment marks 22, the third set of alignment marks 24, the fourth set of alignment marks 26 and the fifth set of alignment marks 28 on the glass substrate 20 designed for corresponding to the second mask, the third mask, the fourth mask and the fifth mask have different position coordinates respectively i.e. different x-coordinates and different y-coordinates. (Similarly, each set of the alignment marks at the bottom of the LCD panel area 10-1 also have different x-coordinates and different y-coordinates). In other words, relative to an arbitrary point on the glass substrate 20 or relative to an arbitrary side of the LCD panel area 10-1, the respective x-coordinates and y-coordinates of the centers of the second set of alignment marks 22, the third set of alignment marks 24, the fourth set of alignment marks 26 and the fifth set of alignment marks 28 are all different to one another. Namely, the second set of alignment marks 22, the third set of alignment marks 24, the fourth set of alignment marks 26 and the fifth set of alignment marks 28 are not arranged with linear symmetric design, but arranged with offset design. For example, the opposite distances between the second set of alignment marks 12, the third set of alignment marks 14, the fourth set of alignment marks 16 and the fifth set of alignment marks 18 are gradually increased or decreased in sequence. Alternatively, the opposite distances between the second set of alignment marks 22, the third set of alignment marks 24, the fourth set of alignment marks 26 and the fifth set of alignment marks 28 can be gradually increased and then decreased in sequence. The following masks, such as the second mask, the third mask, the fourth mask and the fifth mask are employed to perform photolithography process to the glass substrate 20 to form patterns according to the sequence of aforesaid masks. Therefore, when the third mask is employed for photolithography process, wrong alignment with the alignment mark on the glass substrate 20 for other masks, such as the second mask, the fourth mask or the fifth mask cannot happen. As shown in FIG. 7, if the alignment mark of the wrong mask is being aligned, the wrong alignment mark can be judged according to the relative positions of the alignment marks A, C of the third mask and the alignment mark B (24) on the glass substrate 20 shown on the monitor in the alignment system of the lithography system and the alignment procedure cannot complete.

Please further refer to FIG. 4, FIG. 5, FIG. 6 and FIG. 7. As aforementioned on the first mask 10, the second set of alignment marks 12, the third set of alignment marks 14, the fourth set of alignment marks 16 and the fifth set of alignment marks 18 of the first mask 10 are arranged at top and bottom of the LCD panel area 10-1 oppositely and correspondingly. Corresponding to the second mask, the third mask, the fourth mask and the fifth mask, the first mask 10 comprises respective sets of alignment marks at the top and bottom of the same LCD panel area 10-1. Each set of the alignment marks comprises at least two alignment marks at the top and bottom. That is as shown in FIG. 5 and FIG. 6, the glass substrate 20 totally comprises three pairs, six alignment marks at the top and bottom of the same LCD panel area 10-1 but the present invention is not limited thereto. Moreover, as shown in FIG. 4 and FIG. 6, the opposite distance $D_2$ between two alignment marks 12 of the second set oppositely positioned at the top and bottom, the opposite distance $D_3$ between two alignment marks 14 of the third set oppositely positioned at the top and bottom, the opposite distance $D_4$ between two alignment marks 16 of the fourth set oppositely positioned at the top and bottom and the opposite distance $D_5$ between two alignment marks 18 of the fifth set oppositely positioned at the top and bottom are all different on another, i.e. $D_2 \neq D_3 \neq D_4 \neq D_5$. As aforementioned, corresponding to the same LCD panel area 10-1, the second set of alignment marks 22, the third set of alignment marks 24, the fourth set of alignment marks 26 and the fifth set of alignment marks 28 on the glass substrate 20 are arranged at the top and bottom oppositely and correspondingly. That is, corresponding to the second mask, the third mask, the fourth mask and the fifth mask, each set of the alignment marks 22, 24, 26, 28 on the glass substrate 20 totally comprises three pairs, six alignment marks at the top and bottom of each LCD panel area 10-1 for each mask. Meanwhile, the distance $D_2$ between two alignment marks 22 of the second set oppositely positioned at the top and bottom, the distance $D_3$ between two alignment marks 24 of the third set oppositely positioned at the top and bottom, the distance $D_4$ between two alignment marks 26 of the fourth set oppositely positioned at the top and bottom and the distance $D_5$ between two alignment marks 28 of the fifth set oppositely positioned at the top and bottom are all different on another, i.e. $D_2 \neq D_3 \neq D_4 \neq D_5$. As shown in FIG. 7, according to the present invention, the alignment procedure cannot complete if the alignment mark of the wrong mask is being aligned in the alignment system of the lithography system. Therefore, the rework or even abandonment circumstances of the glass substrate cause of employing the alignment mark of the wrong mask can be prevent. Furthermore, the manufacture yield rate of LCD panel can be improved.

Furthermore, the present invention provides another LCD panel photolithography process, employed in a lithography system for manufacturing a plurality of LCD panel as well to perform photolithography to a glass substrate for manufacturing the plurality of LCD panels. Please refer to FIG. 4, FIG. 5, FIG. 6 and FIG. 7. Detail description of another LCD panel photolithography process according to the present invention is introduced below:

When the first mask 10 is employed for performing photolithography to the glass substrate 20 to form a first metal layer, the first mask 10 also comprises the set of alignment marks 12 needed for the following second mask, or the two sets of alignment marks 12, 14 needed for the following second mask and following third mask as illustration. Therefore, as the first mask 10 is employed performing photolithography to the glass substrate 20, the set of alignment marks 22 corresponding to the following second mask, or the two sets of alignment marks 22, 24 corresponding to the following second mask and following third mask are formed at the same time. After the following second mask, or the following second mask and following third mask are employed for performing alignment procedure and photolithography to the glass substrate 20 according to the sequence thereof to form patterns, because the last mask also comprises the set of alignment marks 14 needed for the following third mask, or the two sets of alignment marks 16, 18 needed for the following fourth mask and following fifth mask as illustration, when the last mask (i.e. the second mask or the third mask) is employed for performing photolithography to the glass substrate 20, the set of alignment marks 24 corresponding to the following third mask, or the two sets of alignment marks 26, 28 corresponding to the following fourth mask and following fifth mask are formed at the same time. Furthermore, although the set of the alignment marks corresponding to the following one mask, or the two set of the alignment marks corresponding to the following two masks are illustrated as aforementioned, the plurality of sets of alignment marks corresponding to the following three masks, or even following five masks or following six masks can be formed at the same time. The number of the alignment marks for the following masks is not limited in the present invention. It depends on the preferred plan for the processes of multiple masks according to the process demands of the LCD panel. Hereby, the present invention can be applied for the LCD panel manufacture processes which are more complicated and need more masks. The present invention further conforms to the rapid development of the LCD panel industry today.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A mask, employed in a photolithography process of a lithography system for manufacturing a plurality of LCD panel, for performing photolithography to a glass substrate for manufacturing the plurality of LCD panels, characterized in that the mask comprises:
    a plurality of LCD panel areas, employed for forming patterns on the glass substrate; and
    a plurality of sets of alignment marks, employed for forming a plurality of sets of alignment marks corresponding to the plurality of following masks thereafter, and the plurality of sets of alignment marks for the plurality of following masks have different position coordinates on the mask respectively.

2. The mask of claim 1, characterized in that at two sides of the same LCD panel area, the respective sets of alignment marks corresponding to the respective masks comprises at least two alignment marks, and the at least two alignment marks of each set of alignment marks have different opposite distances.

3. The mask of claim 2, characterized in that at the two sides of the same LCD panel area, the opposite distances between the at least two alignment marks are gradually increased or decreased in sequence.

4. The mask of claim 2, characterized in that at the two sides of the same LCD panel area, the opposite distances between the at least two alignment marks of the each set of alignment marks are gradually increased and then decreased in sequence.

5. The mask of claim 1, characterized in that at the two sides of the same LCD panel area, the plurality of sets of alignment marks have respective x-coordinates and y-coordinates relative to an arbitrary side of the same LCD panel area.

* * * * *